United States Patent
Lin et al.

(10) Patent No.: US 7,388,407 B2
(45) Date of Patent: Jun. 17, 2008

(54) VARIABLE DELAY CLOCK SYNTHESIZER

(75) Inventors: Chia-Liang Lin, Union City, CA (US); Gerchih Chou, San Jose, CA (US)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 11/860,108

(22) Filed: Sep. 24, 2007

(65) Prior Publication Data
US 2008/0007305 A1    Jan. 10, 2008

Related U.S. Application Data

(62) Division of application No. 11/284,518, filed on Nov. 21, 2005, now Pat. No. 7,274,232.

(60) Provisional application No. 60/594,180, filed on Mar. 17, 2005.

(51) Int. Cl.
*H03B 21/50* (2006.01)
*H03L 7/00* (2006.01)
(52) U.S. Cl. .................. 326/262; 327/261; 327/158
(58) Field of Classification Search ........ 327/261–263, 327/270, 307, 105, 161, 152, 158, 149
See application file for complete search history.

(56) References Cited

U.S. PATENT DOCUMENTS

| | | | | |
|---|---|---|---|---|
| 4,388,595 A | * | 6/1983 | Brooks | 329/336 |
| 6,324,231 B1 | * | 11/2001 | Huang | 375/346 |
| 6,496,227 B1 | * | 12/2002 | Lemaitre | 348/638 |
| 6,707,330 B2 | | 3/2004 | Nakanishi | |
| 7,038,511 B2 | | 5/2006 | Kim et al. | |
| 7,076,013 B2 | | 7/2006 | Cho | |

FOREIGN PATENT DOCUMENTS

JP            402212723      *   8/1990

OTHER PUBLICATIONS

Stefanos Sidiropoulos et al., *A Semidigital Dual Delay-Locked Loop*; IEEE Journal of Solid-State Circuits, vol. 32, No. 11, Nov. 1997.
Mark G. Johnson, et al., *A Variable Delay Line PLL for CPU-Coprocessor Synchronization*; IEE Journal of Solid-State Circuits, vol. 23, No. 5, Oct. 1998.

* cited by examiner

*Primary Examiner*—Dinh T. Le
(74) *Attorney, Agent, or Firm*—Knobbe, Martens, Olson & Bear LLP

(57) ABSTRACT

In an embodiment, a fine resolution of variable clock delay is implemented using a variable DC offset having fine resolution. The proportional ratio between the DC offset and the phase delay/advance of the clock is calibrated in a closed-loop manner. In another embodiment, in a calibration circuit, an adaptive positive DC offset is added to the output of a delay buffer to advance the phase of the clock output, which also has a phase delay from the delay buffer. The DC offset is adjusted in a closed-loop manner to make the phase advance, due to the DC offset, compensate for the phase delay, due to the delay buffer. Once the phase relationship of the DC offset to the clock phase advance is calibrated, the DC offset can be scaled and added to the output of another buffer of the same type to achieve a desired phase delay or advance of the clock signal.

18 Claims, 7 Drawing Sheets

VARIABLE DELAY CLOCK SYNTHESIZER

This application is a divisional of U.S. patent application Ser. No. 11/284,518 entitled "Variable Delay Clock Synthesizer," filed on Nov. 21, 2005, which claims priority benefits under 35 U.S.C. § 119(e) from U.S. Provisional Application No. 60/594,180 entitled "Variable Delay Clock Synthesizer," filed on Mar. 17, 2005, each of which is hereby incorporated herein in its entirety by reference.

BACKGROUND OF THE INVENTION

1. Field of the Invention

The present invention relates to a method and apparatus for generating a variable delay clock and in particular to a system of controlling the delay of a clock with high resolution in the delay.

2. Description of the Related Art

There are several methods to delay a clock signal. One method to delay a clock is to insert a delay buffer, such as a CMOS delay buffer, in the clock signal. A CMOS delay buffer typically comprises two CMOS inverters, each of which can comprise a NMOS transistor and a PMOS transistor. The delay to the clock caused by the buffer depends on many factors, including the clock speed, the transistor sizes, the supply voltage, and the temperature. Therefore, it is very difficult to accurately control the delay using a simple delay buffer.

For high-speed applications, current mode logic (CML) is usually used in lieu of CMOS logic. CML is typically implemented in differential circuit configuration. A CML delay buffer can comprise, for example, a single differential transistor pair, a biasing transistor, and a pair of load transistors. Unlike the above-mentioned CMOS buffer, the delay caused by CML delay buffer can be controlled by adjusting the bias voltages. However, the delay still cannot be accurately controlled unless the bias voltages are adjusted in a close-loop manner. In a typical embodiment, a delay lock loop (DLL) is used to perform the close loop control of a delay buffer.

The DLL circuit uses a clock multiplex circuit to implement a variable delay. However, a high frequency clock multiplexer is difficult to design, especially when the number of inputs is high. The multiplexer selects among N clocks of different phases generated by an N-stage DLL. The resolution of the delay depends on the number of stages of delay buffers. In general, an N-stage DLL has a resolution of 180/N degree in phase delay. To achieve a 10-degree resolution of phase delay, for example, it takes an 18-stage DLL. Therefore, it is impractical to use DLL to generate a variable delay clock with high resolution in the phase delay.

SUMMARY OF THE INVENTION

The clock phase is characterized by its rising edge, where the zero crossing of the clock occurs. The rise time of a clock is limited by the slew rate of the output device. Near the rising edge, the clock signal rises almost linearly due to the finite slew rate of the output device. An intentionally added DC offset to the clock output does not significantly change the clock waveform, but it changes the zero crossing location and therefore the clock phase. In an embodiment, a delay or advance of clock phase can be achieved by adding a negative or positive DC offset to the clock output.

Since the clock rises linearly near the zero crossing, the delay or advance of clock phase also depends linearly on the DC offset added to the clock output. In an embodiment, a fine resolution of variable clock delay is implemented using a variable DC offset having fine resolution. In an embodiment, the proportional ratio between the DC offset and the phase delay/advance of the clock is calibrated in a closed-loop manner.

In an embodiment, an adaptive positive DC offset is added to the output of a delay buffer to advance the phase of the clock output, which also has a phase delay from the delay buffer. The DC offset is adjusted in a closed-loop manner such that the phase advance due to the DC offset compensates for the phase delay due to the delay buffer. Once the phase relationship of the DC offset to the clock phase advance is established, the DC offset can be scaled and added to the output of another buffer of the same type to achieve a desired phase delay or advance of the clock signal.

In an embodiment, a variable delay clock synthesizer comprises a phase detector circuit that receives an input clock signal and a reference signal, a low pass filter that filters the phase detector output and generates a first control signal, a scaling circuit that scales the first control signal and generates a second control signal, a first variable delay circuit that receives the input clock signal and generates the reference signal by delaying the input clock signal wherein the amount of delay is variable and controlled by the first control signal, and a second variable delay circuit that receives the input clock signal and generates an output clock signal by delaying the input clock signal wherein the amount of delay is variable and controlled by the second control signal.

In another embodiment, a method of generating a variable delay clock signal comprises receiving an input clock signal, generating a reference signal from the input clock signal using a first variable delay circuit controlled by a first control signal, comparing the phase difference between the input clock signal and the reference signal using a phase detector, filtering the output of the phase detector using a low pass filter to generate the first control signal, scaling the first control signal to generate a second control signal, and generating the output clock from the input clock signal using a second variable delay circuit controlled by the second control signal.

In a further embodiment, a variable delay buffer comprises a buffer circuit to receive an input signal and generate an output signal, and a summing circuit to adjust the zero-crossing of the output signal by adding a voltage offset to the output signal wherein the voltage offset is variable and controlled by a control signal.

In yet another embodiment, a method of generating a clock signal with a variable delay comprises receiving an input clock signal using a slew-rate limited buffer circuit, and adjusting the zero-crossing of the output signal of the buffer circuit by adding an offset voltage to the output signal, wherein the offset voltage is variable and controlled by a control signal.

In an embodiment, a variable delay clock synthesizer comprises a phase detector that receives an input clock signal and a reference signal and estimates the phase difference between the two, a filter that filters the phase difference estimate from the phase detector and generates a first control signal, a scaling function that scales the first control signal and generates a second control signal, a first variable delay circuit in communication with the input clock, where the first variable delay circuit delays the input clock signal and generates accordingly the reference signal wherein the amount of delay is controlled by the first control signal, and a second variable delay circuit in communication with the input clock, where the second variable delay circuit delays the input clock signal and generates accordingly the output clock signal wherein the amount of delay is controlled by the second control signal.

In another embodiment, a method of generating a variable delay clock signal comprises receiving with a phase detector an input clock signal and a reference signal and estimating the phase difference between the two, generating a first control signal by filtering the phase detector output, generating a second control signal by scaling the first control signal, receiving with a first variable delay circuit the input clock signal and generating the reference signal which has a delay relative to the input clock signal wherein the delay is controlled by the first control signal, and receiving with a second variable delay circuit the input clock signal and generating the output clock signal which has a delay relative to the input clock signal wherein the delay is controlled by the second control signal.

In a further embodiment, a variable delay clock synthesizer comprises means for receiving an input clock signal and a reference signal, means for comparing the phase of the input clock signal with the phase of the reference signal, means for filtering the output of the phase detector and generating a first control signal, means for scaling the first control signal and generating a second control signal, means for generating the reference signal from the input clock signal using a first variable delay circuit wherein the delay is controlled by the first control signal, and means for generating the output clock signal from the input clock signal using a second variable delay circuit wherein the delay is controlled by the second control signal.

In an embodiment, a variable delay clock synthesizer comprises a first delay buffer, where the first delay buffer receives an input signal and delays the input signal to produce a first delay output signal, a first adder, where the first adder adds a first offset voltage to the first delay output signal to produce a reference signal, where the first offset voltage is controlled by a first control signal. The variable delay clock synthesizer further comprises a phase detector, where the phase detector compares a phase difference between the input signal and the reference signal to produce an estimate of phase error, and a filter, where the filter filters the estimate of the phase error to produce the first control signal. The variable delay clock synthesizer further comprises a scaling function that scales the first control signal and generates a second control signal. The variable delay clock synthesizer further comprises a second delay buffer, where the second delay buffer receives the input signal and delays the input signal to produce a second delay output signal, and a second adder, where the second adder adds a second offset voltage to the second delay output signal to produce a variable delay output signal, where the second offset voltage is controlled by the second control signal.

In yet another embodiment, a method of controlling a phase of a clock signal comprises adding a DC offset voltage to a slew-rate limited clock signal, where when the DC offset voltage is positive, the clock phase is advanced and when the DC offset voltage is negative, the clock phase is delayed, and where the phase advance or delay is proportional to the DC offset voltage.

In a further embodiment, a variable delay clock synthesizer comprises a delay buffer circuit that receives an input clock signal and outputs a delayed clock signal, and a summing circuit that adds a DC offset to the delayed clock signal, where the DC offset is variable and controlled by a control signal.

For purposes of summarizing the invention, certain aspects, advantages, and novel features of the invention have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention. Throughout the drawings, reference numbers are re-used to indicate correspondence between referenced elements. In addition, the first digit of each reference number indicates the figure in which the element first appears.

DETAILED DESCRIPTION OF THE PREFERRED EMBODIMENT

The present invention relates to a method and apparatus for controlling the phase delay of a clock with high resolution in the delay. While the specifications describes several example embodiments of the invention, it should be understood that the invention can be implemented in many way and is not limited to the particular examples described below or to the particular manner in which any features of such examples are implemented.

Figure 1A:
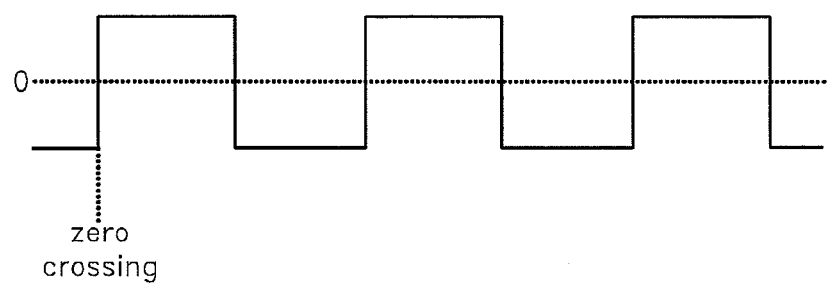
FIG. 1A is a schematic diagram of an embodiment of an ideal clock signal.
Figure 1B:
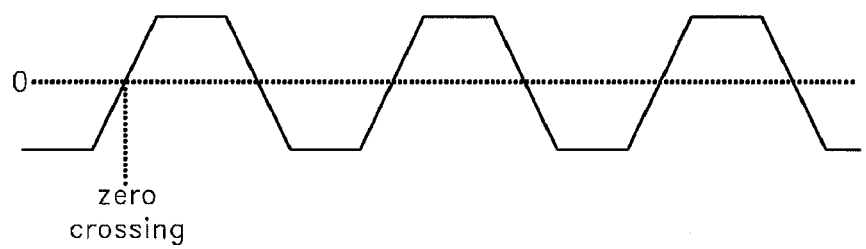
FIG. 1B is a schematic diagram of an embodiment of a slew-rate limited clock signal.
Figure 1C:
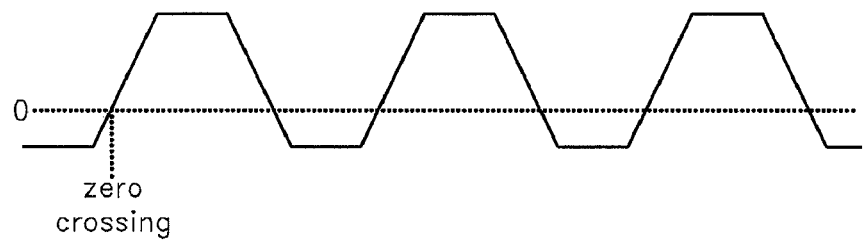
FIG. 1C is a schematic diagram of an embodiment of a slew-rate limited clock signal with a positive DC offset.
Figure 1D:
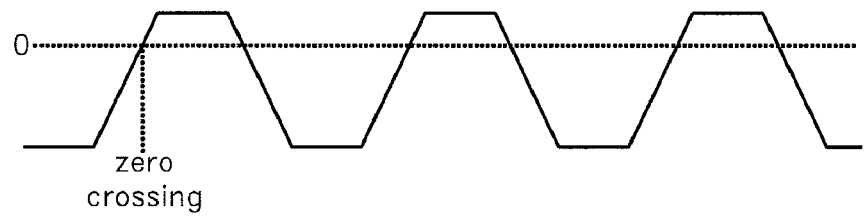
FIG. 1D is a schematic diagram of an embodiment of a slew-rate limited clock signal with a negative DC offset.

An ideal clock signal has an infinite slew rate, as shown in FIG. 1A. In practice, a realistic clock is slew-rate limited and therefore rises almost linearly near the zero crossing, as shown in FIG. 1B. Adding a positive DC offset to the slew-rate limited clock, pulls the zero-crossing point ahead and therefore the clock phase is advanced, as shown in FIG. 1C. Adding a negative DC offset to the slew-rate limited clock, pushes the zero-crossing point behind and therefore the clock phase is delayed, as shown in FIG. 1D. Once the slew-rate is known, the clock phase can be advanced or delayed a known amount by adding a predetermined positive or negative DC offset to the clock output, according to embodiments of the invention.

Figure 2:
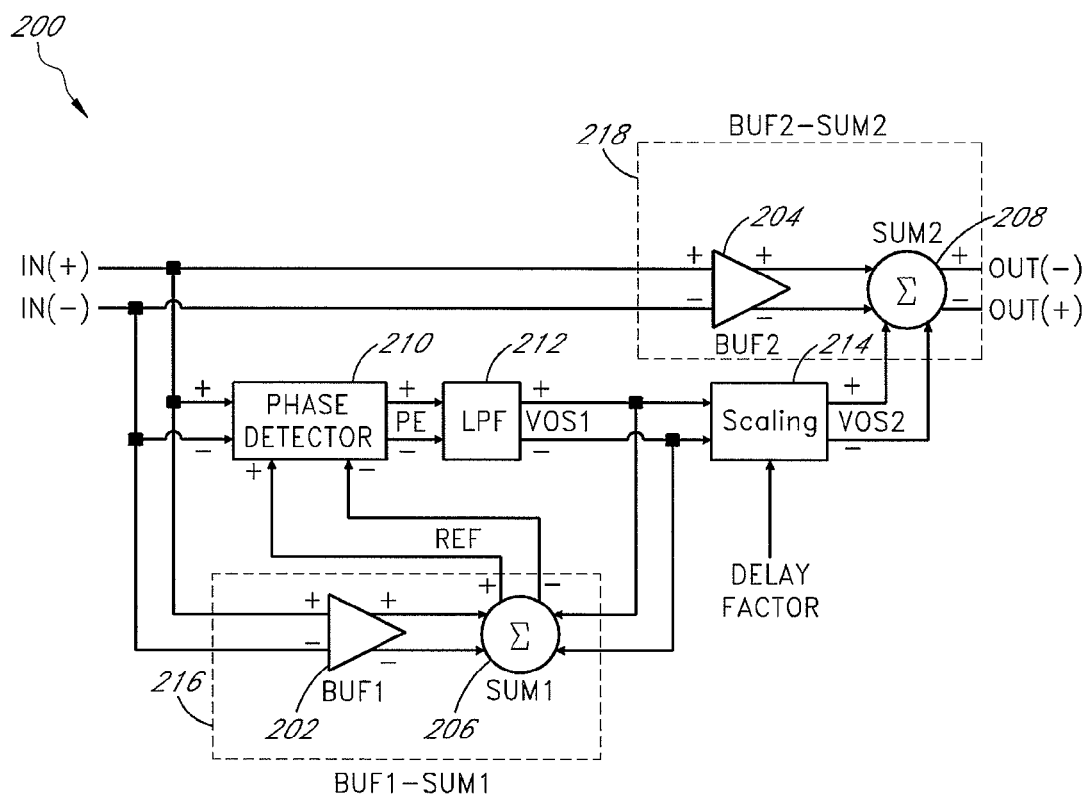
FIG. 2 is a schematic diagram of an embodiment of a variable delay clock synthesizer.

FIG. 2 is a schematic diagram of an embodiment of a variable delay clock synthesizer 200 comprising a first delay buffer BUF1 202, a second delay buffer BUF2 204, a first summing circuit SUM1 206, a second summing circuit SUM2 208, a phase detector 210, a low pass filter 212, and a multiplier 214. In an embodiment, the delay buffer BUF1 202 and summing circuit SUM1 206 can be combined as a single circuit, a first delay circuit, BUF1-SUM1 216. Likewise, in an embodiment, the delay buffer BUF2 204 and summing circuit SUM2 208 can be combined as a single circuit, a second delay circuit, BUF2-SUM2 218. In an embodiment, a zero-crossing offset circuit comprises the second delay buffer BUF2 204, the second summing circuit SUM2 208, and the multiplier 214.

A differential clock input signal is formed by two signals IN(+) and IN(−). The positive end signal IN(+) connects to a positive input of the first delay buffer BUF1 202, a positive input of the second delay buffer BUF2 204, and a first positive input of the phase detector 210. The negative end signal IN(−) connects to a negative input of the first delay buffer BUF1 202, a negative input of the second delay buffer BUF2 204, and a first negative input of the phase detector 210.

A positive end and a negative end of the output of the phase detector 210 connect to a first and a second input, respectively, of the low pass filter 212. A first and a second output of the low pass filter connect to a first and a second input, respectively, of the first summing circuit SUM1 206 and a first and a second input, respectively, of the multiplier 214. A positive end of the output of the first delay buffer BUF1 202 connects to a third input of the first summing circuit SUM1 206, and a negative end of the output of the first delay buffer BUF1 202 connects to a fourth input of the first summing circuit SUM1 206. A positive end of the output of the first summing circuit SUM1 206 connects to a second positive input of the phase detector circuit 210, and a negative end of the output of the first summing circuit SUM1 206 connects to a second negative input of the phase detector circuit 210.

A positive output and a negative output of the second delay buffer BUF2 204 connect to a first and a second input, respectively, of the second summing circuit SUM2 208. A positive and a negative output of the multiplier 214 connect to a third and a fourth input, respectively, of the second summing circuit SUM2 208. A positive output of the second summing circuit SUM2 208 outputs a positive clock output signal OUT(+), and a negative output of the second summing circuit SUM2 208 outputs a negative clock output signal OUT(−). The positive clock output signal OUT(+) and the negative clock output signal (−) comprise a differential clock output signal OUT having a clock phase which is advanced or delayed by a known amount.

In an embodiment, the first delay buffer BUF1 202 and the second delay buffer BUF2 204 are slew-rate limited delay buffers of the same circuit implementation. When the input waveform is approximately the same for each delay buffer 202, 204, the output waveforms of both delay buffers 202, 204 are also approximately the same. Both the first delay buffer BUF1 202 and the second delay buffer BUF2 204 receive the same input from the differential clock input signal IN(+) and IN(−) and each delay buffer 202, 204 generates a slew-rate limited output.

The first summing circuit SUM1 206 adds a first offset voltage VOS1 to the output of the first delay buffer BUF1 202 to produce a differential reference signal REF. The offset voltage VOS1 serves as a control signal to control the phase of the output of the buffer BUF1 202.

The phase detector 210 compares the phase difference between the input signal IN and the reference signal REF. The phase detector 210 estimates the phase error and outputs the phase error estimate signal PE. The low pass filter 212 filters the phase error estimate PE and produces the differential offset voltage VOS1.

A closed loop is therefore formed to continuously adjust the offset voltage VOS1 to make the rising edge of the reference signal REF approximately align with the rising edge of the clock input signal IN. Once the loop settles, the effect of the phase advance caused by the offset voltage VOS1 approximately cancels the phase delay caused by the first delay buffer BUF1 202.

The multiplier 214 scales the offset voltage VOS1 by a delay factor, resulting in a second differential offset voltage VOS2. The second summing circuit SUM2 208 adds the offset voltage VOS2 to the output of the second delay buffer BUF2 204 to produce the differential clock output signal OUT. The offset voltage VOS2 serves as a control signal to control the phase of the output of the buffer 204.

In an embodiment, the multiplier 214, the second summing circuit 208, and the second delay buffer circuit, comprising the zero-crossing offset circuit, adjust the zero-crossing of the clock input signal IN to generate the differential clock output signal OUT.

The delay factor can be either positive or negative. The sign of the delay factor determines whether the output of the second delay buffer BUF2 204 is delayed or advanced. The magnitude of the delay factor determines the amount of delay or advance.

For example, if the delay caused by the delay buffers 202, 204 is 36 degrees and the delay factor is 0.5, then adding the offset voltage VOS2 to the output of the second delay buffer BUF2 204 advances the output of the second delay buffer BUF2 204 by 18 degrees.

Likewise, if the delay caused by the delay buffers 202, 204 is 30 degrees and the delay factor is −0.75, then adding the offset voltage VOS2 delays the output of the second delay buffer BUF2 204 by 27 degrees. Controlling the delay factor with a fine resolution permits a fine resolution of the advance or delay of the clock output signal OUT.

Delay Buffer And Summing Amplifier

Figure 3:
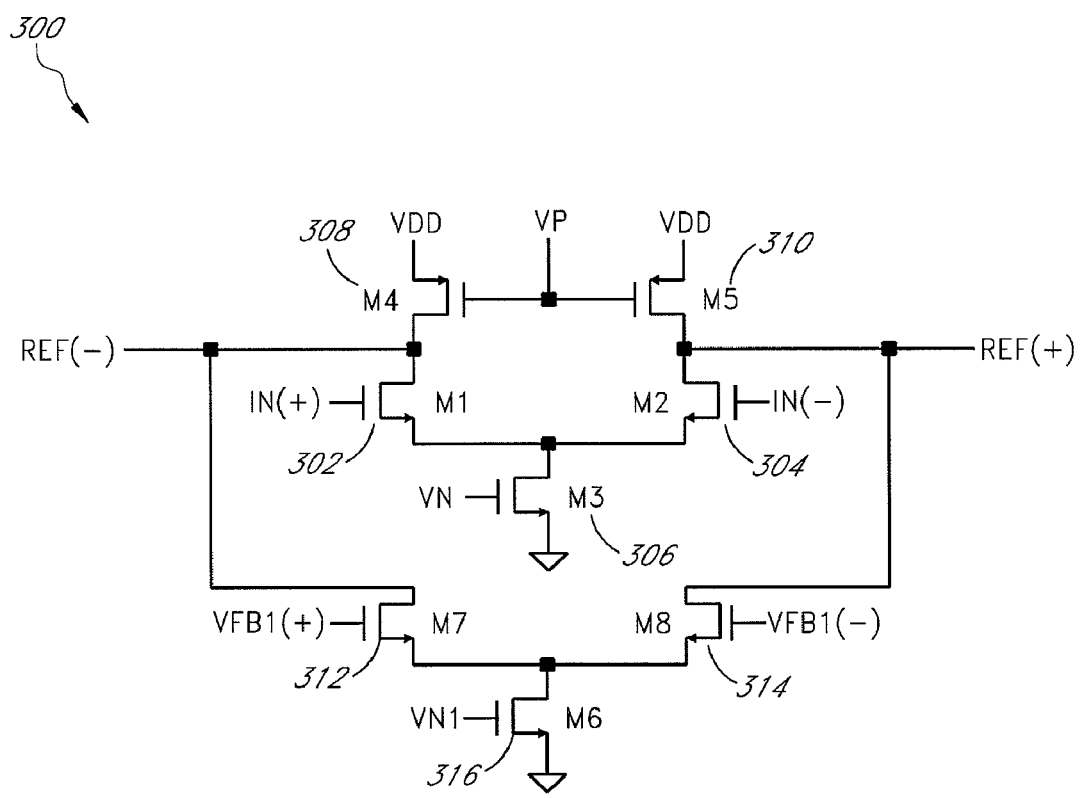
FIG. 3 is a schematic diagram of an embodiment of the delay buffer and summing circuit of FIG. 2 having a unity delay factor.

FIG. 3 is a schematic diagram of an embodiment of a delay buffer and summing circuit BUF-SUM 300. In an embodiment, the first delay buffer BUF1 202 is a CML buffer comprising a differential transistor pair M1-M2 302, 304, respectively, a bias transistor M3 306, and a pair of load transistors M4-M5, 308, 310, respectively. In an embodiment, the transistors 302, 304, 306, 308, 310 are FET transistors, bipolar junction transistors, hetero-junction bipolar transistors, MOSFET, or the like.

The gate of transistor M1 302 connects to the input signal IN(+) and the gate of transistor M2 304 connects to the input signal IN(−). The source of transistor M1 302 and the source of transistor M2 304 connect to the drain of the bias transistor M3 306. The source of the bias transistor M3 306 connects to ground and the gate of the bias transistor M3 306 connects to a first biasing voltage VN.

The gate of the load transistor M4 308 and the gate of the load transistor M5 310 connect to a second biasing voltage VP. The source of the load transistor M4 308 and the source of the load transistor M5 310 connect to a supply voltage VDD. The drain of the load transistor M4 308 connects to the drain of the transistor M1 302, and the reference signal REF(−). The drain of the transistor M5 310 connects to the drain of the transistor M2 304 and the reference signal REF(+). The differential reference signal REF is taken at the differential load.

In an embodiment, the summing amplifier 206 is also a CML buffer comprising a differential transistor pair M7-M8, 312, 314, respectively, a bias transistor M6 316, and the pair of load transistors M4-M5, 308, 310, which are shared with the first delay buffer circuit BUF1 202, as shown in FIG. 3. In an embodiment, the transistors 312, 314, 316 are FET transistors, bipolar junction transistors, hetero-junction bipolar junction transistors, MOSFET, or the like.

The drain of the transistor M7 312 connects to the drain of the transistor M4 308 and the reference signal REF(−). The drain of the transistor M8 314 connects to the drain of the transistor M5 310 and the reference signal REF(+). The gate of the transistor M7 312 connects to a voltage VFB1(+) and the gate of the transistor M8 314 connects to a voltage VFB1(−). The source of the transistor M7 312 and the source of the transistor M8 314 connect to the drain of the bias transistor M6 316. The gate of the bias transistor connects to a third biasing voltage VN1 and the source of the transistor M6 316 connects to ground. The differential voltage formed by VFB1(+) and VFB1(−) serves as a control signal for the BUF-SUM circuit 300 to control the phase of the output clock.

In this embodiment, the delay buffer circuit and the summing circuit are combined as the BUF-SUM circuit 300 and the summation function is performed via sharing the load transistors M4-M5, 308, 310. In other embodiments, the delay buffer circuit BUF1 202 and the summing circuit SUM1 206 are not combined as a single circuit. Likewise the delay buffer circuit BUF2 206 and the summing circuit SUM2 208 are not combined as a single circuit, and it is understood that the delay buffer circuits BUF1 202, BUF2 204 and the summing circuits SUM1 206, SUM2 208 can be implemented in many different ways.

In an embodiment, the output of the low pass filter 212 is no longer an explicit differential voltage VOS1, but instead is a differential voltage VFB1, which serves as a control signal to the BUF-SUM circuit 300. The differential voltage VFB1 effectively generates the differential offset voltage VOS1 at the output.

In an embodiment, the BUF-SUM circuit 300 can be used for the BUF1-SUM1 circuit 216 and the BUF2-SUM2 circuit 218. When the BUF2-SUM2 circuit 216 and the BUF1-SUM1 circuit 218 use circuit implementation as that of the BUF-SUM circuit 300, then the phase advance/delay due to the output offset is approximately the same in both the BUF1-SUM1 circuit 216 and the BUF2-SUM2 circuit 218. That is, in an embodiment, the delay factor in FIG. 2 will be approximately unity (1). In another embodiment, a negative delay factor can be implemented by reversing the polarity of differential control voltage VFB1 in the BUF2-SUM2 circuit 218.

Delay Scaling

Figure 4:
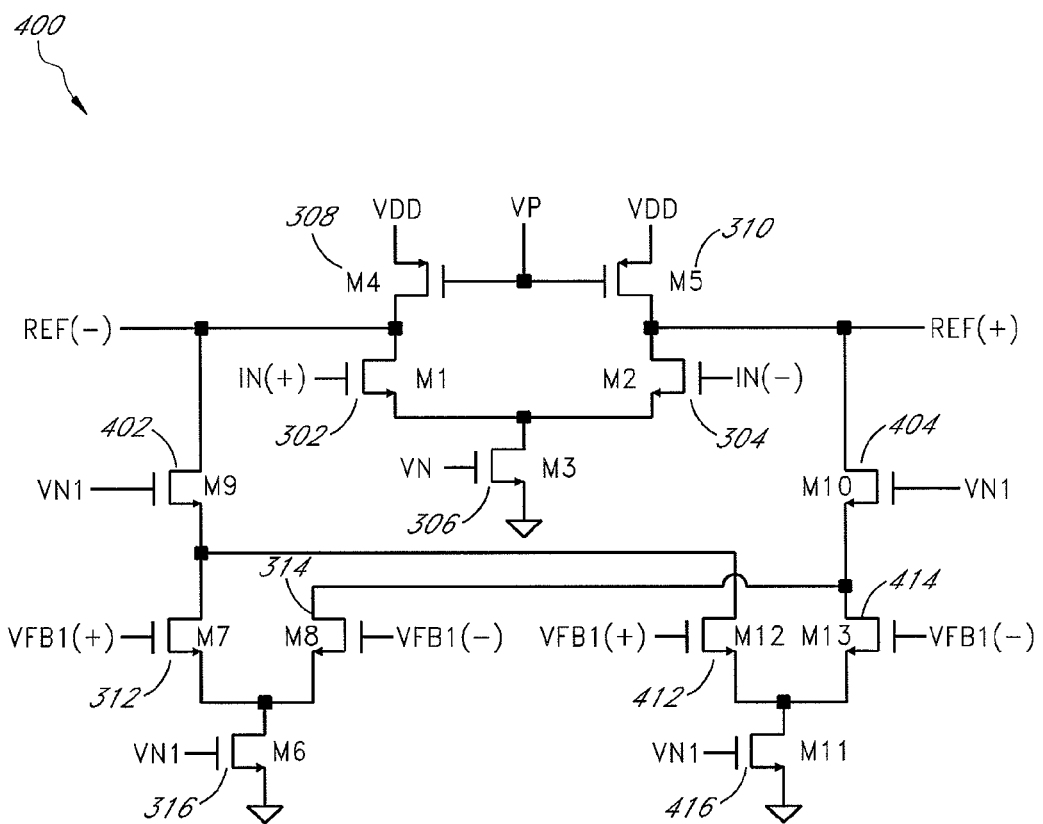
FIG. 4 is a schematic diagram of another embodiment of the delay buffer and summing circuit of FIG. 2 having a half delay factor.

In an embodiment, the BUF-SUM circuit 300 can be modified to accommodate a factional delay factor. The following example is an embodiment of a half delay factor. That is, when implemented, the advance/delay caused by the offset in the BUF2-SUM2 circuit 218 is half of the advance/delay in the BUF1-SUM1 circuit 216. FIG. 4 is a schematic diagram of an embodiment of a delay buffer and summing circuit BUF-SUM 400 having a half delay factor.

As shown in FIG. 4, in an embodiment, the delay buffer and summing circuit BUF-SUM 400 comprises the differential transistor pair M1-M2 302, 304, the bias transistor M3 306, and the pair of load transistors M4-M5, 308, 310. The transistors 302, 304, 306, 308, 310 are connected as described above.

The BUF-SUM circuit 400 further comprises a cascode transistor pair M9-M10 402, 404, respectively, added to the output nodes. In an embodiment, the transistors 402, 404, are FETs, bipolar junction transistors, hetero-junction bipolar transistors, MOSFETs, or the like.

The BUF-SUM circuit 400 further comprises the differential transistor pair M7-M8, 312, 314, respectively, its associated bias transistor M6 316, another differential transistor pair M12-M13, 412, 414, respectively, and its associated bias transistor M11 416. In an embodiment, the transistors 412, 414, 416 are FETs, bipolar transistors, hetero-junction bipolar transistors, MOSFET, or the like.

The drain of the cascode transistor M9 402 connects to the reference signal REF(−), the drain of the load transistor M4 308, and the drain of the transistor M1 302. The gate of the cascode transistor M9 402 connects to a fourth biasing signal VN2. The source of the cascode transistor M9 402 connects to the drain of the transistor M7 312 and the drain of the transistor M12 412.

The drain of the cascode transistor M10 404 connects to the reference signal REF(+), the drain of load transistor M5 310, and the drain of the transistor M2 304. The gate of the transistor M10 404 connects to the biasing signal VN2. The source of the transistor M10 404 connects to the drain of the transistor M8 314 and the drain of the transistor M13 414.

The gate of the transistor M7 312 connects to the control voltage signal VFB1(+) and the gate of the transistor M8 314 connects to the control voltage signal VFB1(−). The source of the transistor M7 312 and the source of the transistor M8 314 connect to the drain of the biasing transistor M6 316. The gate of the biasing transistor M6 316 connects to the biasing voltage VN1 and the source of the biasing transistor M6 316 connects to ground.

The gate of the transistor M12 412 connects to the control voltage signal VFB1(+) and the gate of the transistor M13 414 connects to the control voltage signal VFB1(−). The source of the transistor M12 412 and the source of the transistor M13 414 connect to the drain of the biasing transistor M11 416. The gate of the biasing transistor M11 416 connects to the biasing voltage VN1 and the source of the biasing transistor Ml 1 416 connects to ground.

The outputs of the two differential transistor pairs M7-M8 312, 314 and M12-M13 412, 414 are summed and added to the output of the buffer via the cascode transistor pair M9-M10 402, 404. The differential pair M7-M8 312, 314 contributes approximately the same offset to the output as the differential pair M12-M13 412, 414.

When the BUF2-SUM2 circuit 218 and the BUF1-SUM1 circuit 216 in FIG. 2 use the circuit implementation of the BUF-SUM circuit 400, the phase advance/delay due to the output offset is approximately the same in the BUF1-SUM1 circuit 216 and the BUF2-SUM2 circuit 218.

If one of the differential transistor pairs, M7-M8 or M12-M13, in the BUF2-SUM2 circuit 218 is turned ON in the manner described above and the other differential transistor pair is turned OFF by shutting off the respective tail current provided by the biasing transistor (M6 316 or M11 416) through switching off the respective gate voltage of the biasing transistor from VN1 to zero (not shown in the figure), the advance/delay in the BUF2-SUM2 circuit is approximately half of the advance/delay in the BUF1-SUM1 circuit 216. In this manner, the half delay factor is achieved.

In other words, an implicit scaling function of scaling the control signal by a factor of "½" is realized.

In other embodiments, other fractional delay factors can be generated by adding additional differential transistor pairs and their associated bias transistors. The outputs of the additional transistor pairs are summed and added to the output of the buffer circuit via the cascode transistor pair M9-M10 402, 404.

In general, a rational delay factor of approximately P/Q can be achieved by using Q active differential transistor pairs with their associated biasing transistors in the BUF1-SUM1 circuit 216 and P active differential transistor pairs with their associated biasing transistors in the BUF2-SUM2 circuit 218. By implementing the general BUF-SUM circuit 400 configuration for the BUF1-SUM1 circuit 216 and the BUF2-SUM2 circuit 218, and selectively turning off Q-P of the differential pairs in the BUF2-SUM2 circuit 218, a variable delay, which has a resolution of approximately 1/Q in the delay factor, is produced. In this manner, an implicit scaling function of scaling the offset of the output of the buffer by a factor of "P/Q" is realized.

Phase Detector

Figure 5:
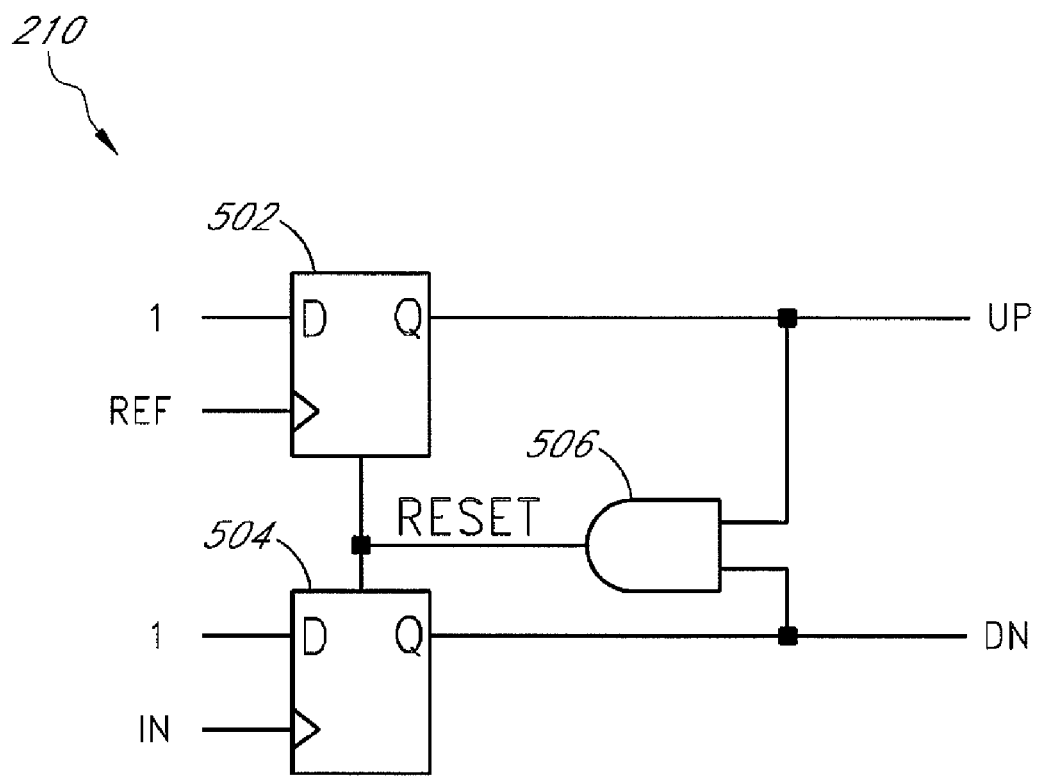
FIG. 5 is a schematic diagram of an embodiment of the phase detector of FIG. 2.

The phase detector 210 can be implemented in various ways and they are well known to those who are skillful in phase lock loop design. FIG. 5 is a schematic diagram of an embodiment of the phase detector 210 of FIG. 2.

In an embodiment, the phase detector 210 comprises a first flip-flop 502, a second flip-flop 504 and a logic AND gate 506. In an embodiment, the flip-flops 502, 504 are D flip-flops. In the first flip-flop 502, the D input connects to a logic 1 signal, the clock input connects to the reference clock signal REF, and the reset input connects to the output of the logic AND gate 506. The Q output of the first flip-flop 502 connects to a first input of the logic AND gate 506 and provides the phase detector output UP.

In the second flip-flop 504, the D input connects to a logic 1 signal, the clock input connects to the input signal IN, and the reset input connects to the output of the logic AND gate 506. The Q output of the second flip-flop connects to a second input of the logic AND gate 506 and provides the phase detector output DN.

The phase detector 210 generates an DN pulse when the rising edge of the clock signal IN leads the rising edge of the reference signal REF, and a UP pulse when the rising edge of the clock signal IN trails the rising edge of the reference signal REF. FIG. 5 illustrates a single-ended circuit diagram.

In another embodiment, the phase detector 210 is implemented as a differential circuit. In the differential implementation of the phase detector 210 the differential input clock signals IN(+), IN(−) and the differential reference signals REF(+), REF(−) are the inputs and the signals UP, UPB, which is the inverse of UP, DN, and DNB, which is the inverse of DN, are the phase detector outputs.

Low Pass Filter

Figure 6:
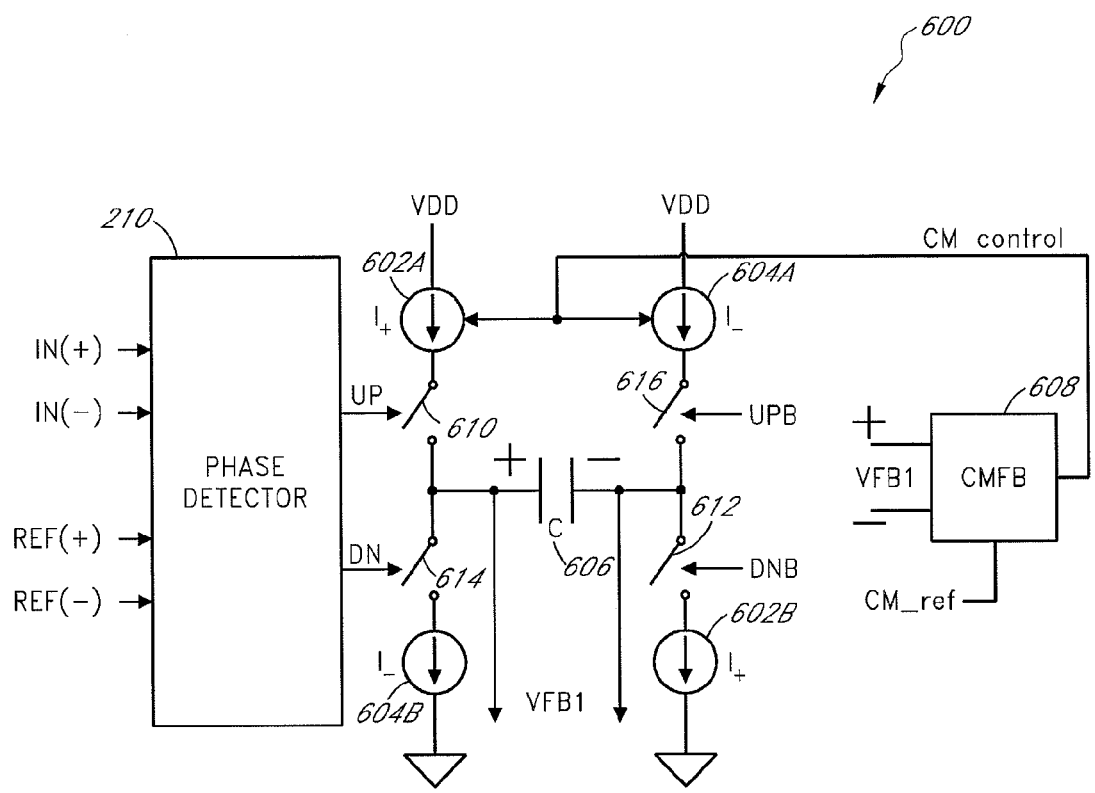
FIG. 6 is a block diagram of an embodiment of a differential charge pump circuit used to produce the offset voltage of FIG. 2.

FIG. 6 is a block diagram of an embodiment of a differential charge pump circuit 600 used to produce the offset voltage VFB1 of FIG. 4. In an embodiment, the differential phase detector 210 is used to control the differential charge pump circuit 600, as shown in FIG. 6.

The differential phase detector 210 receives the differential clock input signals IN(+), IN(−), and the differential reference signals REF(+), and REF(−), and outputs the pulse signals UP and DN, the along with their respective inversions UPB and DNB as discussed above.

In an embodiment, the differential charge pump circuit 600 comprises a first current source I+ 602, a second current source I− 604, a capacitor C 606, a common mode feedback circuit (CMFB) 608, and switches 610, 612, 614, 616. The first current source I+ 602 is shown in FIG. 6 as comprising two current sources, 602A and 602B, for ease of explaining the functional circuit operation. Likewise, the second current source, I− 604 is also shown as comprising two current sources 604A and 604B for ease of explaining the functional circuit operation.

A first input of the current source I+ 602A connects to the supply voltage VDD. A second input of the current source I+ 602A connects to a common mode control output signal, CM control, of the CMFB circuit 608. An output of the current source I+ 602A connects to a first terminal of the switch 610. A second terminal of the switch 610 connects to a first terminal of the switch 614, a positive terminal of the capacitor C 606, and a positive input of the CFMB circuit 608. A second terminal of the switch 614 connects to an input of the current source I− 604B, and an output of the current source I− 604B connects to ground.

A first input of the current source I− 604A connects to the supply voltage VDD. A second input of the current source I− 604A connects to the common mode control output signal, CM control, of the CMFB circuit 608. An output of the current source I− 604A connects to a first terminal of the switch 616. A second terminal of the switch 616 connects to a first terminal of the switch 612, a negative terminal of the capacitor C 606, and a negative input of the CFMB circuit 608. A second terminal of the switch 612 connects to an input of the current source I+ 602B, and an output of the current source I+ 602B connects to ground.

A predefined common mode reference signal, CM_ref, connects to an input of the CMFB circuit 608. The phase detector output signal UP functionally controls the switch 610 such that when the signal UP has a logic 1 value, the switch 610 is closed, and when the output signal UP has a logic 0 value, the switch 610 is open. Likewise, the phase detector output signal UP functionally controls the switch 612 such that when the signal UP has a logic 1 value, the switch 612 is closed, and when the output signal UP has a logic 0 value, the switch 612 is open. Likewise, the phase detector output signal DN functionally controls the switch 614 such that when the signal DN has a logic 1 value, the switch 614 is closed, and when the output signal DN has a logic 0 value, the switch 614 is open. Likewise, the phase detector output signal DN functionally controls the switch 616 such that when the signal DN has a logic 1 value, the switch 616 is closed, and when the output signal DN has a logic 0 value, the switch 616 is open.

The control voltage VFB1, which controls the offset of the BUF-SUM circuit 400, is the voltage across the capacitor C 606. When UP=1 and DN=0, the current I+ charges the capacitor C 606 and therefore differential voltage VFB1 increases. When UP=0 and DN=1, the current I− discharges the capacitor C 606 and therefore the differential voltage VFB1 decreases. In a differential circuit, a common mode feedback circuit, such as the CMFB circuit 608, establishes a common mode voltage for both ends of the differential voltage. The mean value of VFB1+ and VFB1− is compared with the predefined common mode reference value CM_ref in the CMFB circuit 608. The CMFB circuit 608 produces the common mode control signal, CM control, which controls the current sources I+ 602A and I− 604A to increase or decrease the common mode of the VFB1 signal to draw it to the desired common mode value, CM_ref.

Calibration Of Delay Buffer

Figure 7:
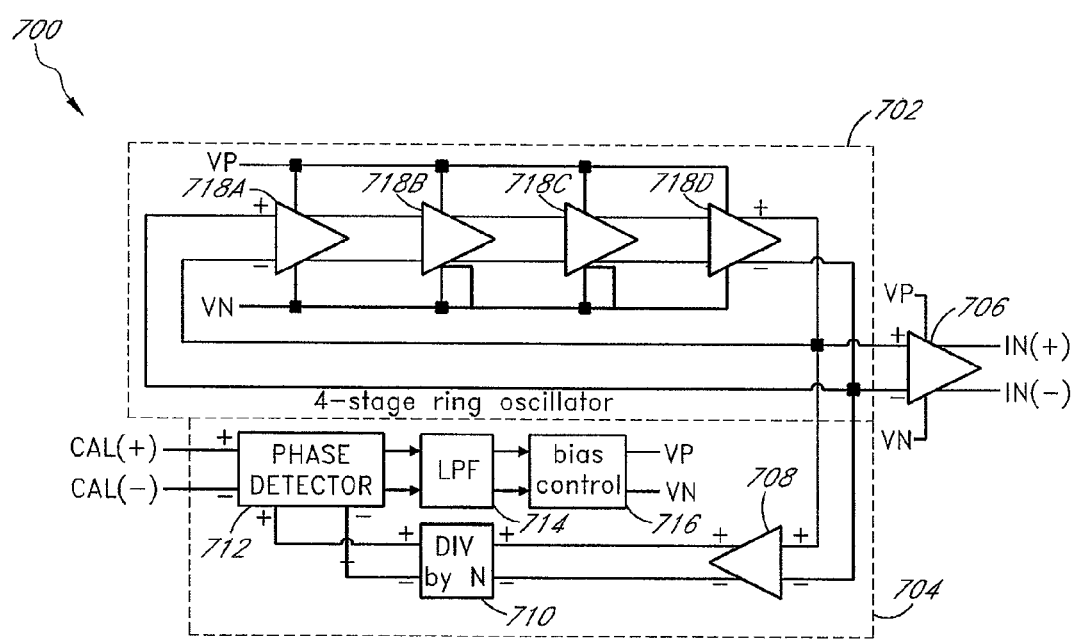
FIG. 7 is a schematic diagram of an embodiment of a calibration circuit used to calibrate the delay buffer of FIG. 2.

Although the output offset in the BUF2-SUM2 circuit 218 results in a phase advance/delay proportional to the phase advance due to the output offset in the BUF1-SUM1 circuit 216, the absolute phase advance/delay is unknown unless the delay of the buffer BUF1 202 is calibrated. FIG. 7 is a schematic diagram of an embodiment of a calibration circuit 700 used to calibrate the delay buffer BUF1 202. The calibration circuit 700 comprises a ring oscillator 702, a phase lock loop (PLL) 704, and a differential output buffer 706.

The ring oscillator 702 comprises delay stages 718. In the embodiment illustrated in FIG. 7, the ring oscillator 702 comprises four stages of delay cells 718A, 718B, 718C, 718D. In other embodiments, ring oscillators 702 with less than four or more than four stages of delay cells 718 can be used. All stages of delay cells are of the same circuit; therefore they cause the same delay to the clock signal. The differential output buffer 706 is also constructed from a similar circuit, so that the output slew rate and waveform are similar to those of the ring oscillator 702.

In an embodiment, the phase lock loop 704 comprises a buffer 708, a divide by N circuit 710, a phase detector 712, a low pass filter 714, and a bias control circuit 716. In an embodiment, the bias control circuit 716 outputs four biasing voltages, VP, VN, VN1, and VN2.

In the ring oscillator 702, a positive output of the last delay cell 718D connects to a negative input of the first delay cell 718A, and a negative output of the last delay cell 718D connects to a positive input of the first delay cell 718A. A first input of each cell 718A-718D connects to the biasing voltage VP, and a second input of each cell 718A-718D connects to the biasing voltage VN.

A first input of the buffer 706 connects to the biasing voltage VP and a second input of the buffer 706 connects to the biasing voltage VN. The positive output of the buffer 706 is the positive clock input signal IN(+) of FIG. 2 and the negative input of the buffer 706 is the negative clock input signal IN(−) of FIG. 2.

The positive output of the last delay cell 718D also connects to the positive input of the buffer 706 and the positive input of the buffer 708. The negative output of the last delay cell 718D also connects to the negative input of the buffer 706 and the negative input of the buffer 708.

The positive output of the buffer 708 connects to the positive input of the divide by N circuit 710. The negative output of the buffer 708 connects to the negative input of the divide by N circuit 710. The positive output of the divide by N circuit 710 connects to a first positive input of the phase detector 712. The negative output of the buffer 710 connects to a first negative input of the phase detector 712. The positive end of a calibration signal CAL(+) connects to a second positive input of the phase detector 712 and the negative end of the calibration signal CAL(−) connects to a second negative input of the phase detector 712. A first output of the phase detector 712 connects to a first input of the low pass filter 714 and a second output of the phase detector connects to a second input of the low pass filter 714.

A first output of the low pass filter 714 connects to a first input of the bias control circuit 716 and a second output of the low pass filter 714 connects to a second input of the bias control circuit 716. A first output of the bias control circuit 716 is the biasing voltage signal VP and a second output of the bias control circuit 716 is the biasing voltage signal VN.

The ring oscillator 702 is placed in the phase lock loop 704 to calibrate the delay of the buffer 718. For example, the 4-stage ring oscillator 702 is placed inside the phase lock loop 704 as shown in FIG. 7. The ring oscillator 702 comprises the four stages of delay cells 718A-718D and the last delay cell output is fed back to the input of the first delay cell 718A with a 180 degree phase shift (i.e. half clock cycle delay) due to polarity reversion. Each of the delay cell 718 causes an additional phase shift of one fourth of half clock cycle. In this manner, the total closed-loop phase shift of the ring oscillator due to the four delay cells and the polarity inversion is a full clock cycle, and therefore a resonance is established. The ring oscillator output is buffered by buffer 708, processed by the divide-by-N circuit 710, and then compared with the reference clock CAL by the phase detector 712. Typically, the reference clock CAL comes from a clock source whose frequency is readily known, for example, from a crystal oscillator, silicon oscillator, ceramic resonator, or the like. The phase error between the reference clock CAL and the output of the divide-by-N circuit 710 is low-pass filtered by low pass filter 714. The low pass filter output controls the bias control circuit 716, which produces VP and VN, the biasing voltages for the delay buffers 718A-718D and output buffer 706.

At steady state, in the illustrated embodiment of FIG. 7, the delay caused by the internal stage is approximately 45 degree phase (one fourth of half-clock cycle) of the resonant output of the ring oscillator, whose frequency will be approximately N-times that of the frequency of the reference clock CAL. For example, if the calibration signal frequency is 25 MHz and N=4, the frequency of the output of ring oscillator 702 will be 100 MHz (10 ns period), and the delay caused by each stage 718 will be 1.25 ns (one fourth of the half clock period).

In this manner, the delay of the delay buffer 718 is calibrated using a calibration signal of a pre-known frequency. In an embodiment, the delay buffer circuit BUF1 202 and the delay buffer circuit BUF2 204 use the circuit implementation as that of the internal delay stage 718 in the ring oscillator 702. When the delay buffer circuit BUF1 202 and the delay buffer circuit BUF2 204 use the circuit implementation and approximately the same biasing voltages VP and VN as that of the internal delay stage 718, the delay in the BUF1-SUM1 circuit 216 and BUF2-SUM2 circuits 218 is also calibrated. In an embodiment, the ring oscillator 702 and the phase lock loop 704 are existing blocks in a clock generation system. Therefore, in an embodiment, the calibration may not require additional hardware.

For those of ordinary skill in the art, the embodiments can also be implemented as single-ended circuits, as opposed to the differential circuits described above. In a differential circuit embodiment, a "zero-crossing" can be defined as the instant where the voltage at the positive end equals the voltage at the negative end. In a single-ended circuit embodiment, on the other hand, "zero-crossing" should not be literally interpreted as the instant where the voltage equals zero. In the single-ended embodiments of the apparatus and methods described above, the "zero-crossing" point can be defined as the "triggering point" of the circuits, such as, for example, flip-flops, latches, or the like.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions, and changes in the form of the methods and systems described herein may be made without departing from the spirit of the inventions. The accompanying claims and their equivalents are intended to cover such forms or modifications as would fall within the scope and spirit of the inventions.

What is claimed is:

1. A variable delay buffer comprising:
a buffer circuit configured to receive an input clock signal and to generate a slew-rate limited buffer output signal with approximately linear rising edges and a first phase delay with respect to the input clock signal;
a multiplier circuit configured to receive a first control signal associated with a first offset voltage for approximately canceling the first phase delay and to generate a second offset voltage by scaling the first offset voltage by a delay factor; and
a summing circuit configured to adjust a zero-crossing of the slew-rate limited buffer output signal to generate an output clock signal with a second phase delay with respect to the input clock signal, wherein the zero-crossing of the slew-rate limited buffer output signal is adjusted by adding the second offset voltage to the slew-rated limited buffer output signal and the second phase delay is variable by adjusting the delay factor to vary the second offset voltage.

2. The variable delay buffer of claim 1, wherein the first offset voltage is proportional to the first control signal.

3. The variable delay buffer of claim 1, wherein a magnitude of the delay factor determines a difference between the first phase delay and the second phase delay.

4. The variable delay buffer of claim 1, wherein a positive delay factor advances a phase of the output clock signal with respect to the slew-rated limited buffer output signal and the second phase delay is less than the first phase delay.

5. The variable delay buffer of claim 4, wherein the second phase delay is a fraction of the first phase delay.

6. The variable delay buffer of claim 4, wherein the second phase delay is approximately zero when the delay factor is approximately unity.

7. The variable delay buffer of claim 1, wherein a negative delay factor delays a phase of the output clock signal with respect to the slew-rate limited buffer output signal and the second phase delay is more than the first phase delay.

8. The variable delay buffer of claim 1, wherein the buffer circuit, the multiplier circuit and the summing circuit are implemented in a single differential current mode logic circuit.

9. The variable delay buffer of claim 8, wherein the single differential current mode logic circuit comprises:
a first differential transistor pair and a first biasing transistor, wherein the first differential transistor pair is configured to receive the input clock signal and to generate the slew-rate limited buffer output signal at differential output nodes;
a plurality of second differential transistor pairs and associated second biasing transistors, wherein each of the second differential transistor pairs is configured to receive the first control signal, the second differential transistor pairs are coupled in a parallel configuration to generate the second offset voltage, and the second offset voltage is provided to the differential output nodes via a cascode transistor pair; and
a pair of load transistors coupled to the differential output nodes and configured to effectively sum the slew-rate limited buffer output signal and the second offset voltage to generate the output clock signal.

10. The variable delay buffer of claim 9, wherein the second offset voltage is approximately equal to the first offset voltage when all of the second differential transistor pairs are active.

11. The variable delay buffer of claim 10, wherein one or more of the second differential transistors are selectively turned off by switching off the respective associated second biasing transistors to generate a second offset voltage that is a fraction of the first offset voltage.

12. The variable delay buffer of claim 11, wherein the delay factor is approximately equal a ratio of a number of active second differential transistor pairs to a total number of second differential transistor pairs and increasing the total number of second differential transistor pairs increases a resolution of the second phase delay.

13. The variable delay buffer of claim 8, wherein the single differential current mode logic circuit comprises field effect transistors or bipolar junction transistors.

14. A method of generating a clock signal with a variable delay comprising:
providing an input clock signal to a slew-rate limited buffer circuit to generate a buffer output signal with a first phase delay;
generating a first offset voltage to approximately cancel the first phase delay;
scaling the first offset voltage by a delay factor to generate a second offset voltage; and
adjusting a zero-crossing of the buffer output signal to generate an output clock signal with a second phase delay, wherein the zero-crossing of the buffer output signal is adjusted by adding the second offset voltage to the buffer output signal and the second phase delay is variable by adjusting the delay factor.

15. The method of claim 14, wherein the second phase delay is a fraction of the first phase delay.

16. The method of claim 14, wherein the slew-rate limited buffer circuit is part of a zero-crossing offset circuit that further comprises a multiplier circuit for scaling the first offset voltage and a summing circuit for adjusting the zero-crossing of the buffer output signal.

17. A variable delay buffer comprising:
a buffer circuit configured to receive an input clock signal and to generate a slew-rate limited buffer output signal with approximately linear rising edges and a first phase delay with respect to the input clock signal; and
a summing circuit configured to adjust a zero-crossing of the slew-rate limited buffer output signal to generate a reference signal with a second phase delay with respect to the input clock signal, wherein the zero-crossing of the slew-rate limited buffer output signal is adjusted by adding an offset signal to the slew-rate limited buffer output signal, the offset signal is generated from the reference signal in a closed loop such that the offset signal effectively cancels the first phase delay in steady state, and the second phase delay with respect to the input clock signal is approximately zero in steady state.

18. The variable delay buffer of claim 17, wherein the buffer circuit and the summing circuit are implemented in a single differential current mode logic circuit comprising:
a first differential transistor pair configured to receive the input clock signal and to generate the slew-rate limited buffer output signal;
a second differential transistor pair configured to receive a feedback signal from the closed loop to generate the offset signal; and
a pair of load transistors coupled to both the first differential transistor pair and the second differential transistor pair at differential output nodes to effectively sum the slew-rate limited buffer output signal with the offset signal to generate the reference signal at the differential output signals.

* * * * *